(12) United States Patent
Dutta et al.

(10) Patent No.: US 11,144,702 B2
(45) Date of Patent: Oct. 12, 2021

(54) METHODS AND SYSTEMS FOR WAFER IMAGE GENERATION

(71) Applicants: Mintu Dutta, Karnataka (IN); Sameera Bharadwaja Hayavadana, Karnataka (IN); Shashank Shrikant Agashe, Karnataka (IN); Rathish Balagangadhar, Karnataka (IN); Anmol Varma, Karnataka (IN); Heon Ju Shin, Hwaseong-si (KR)

(72) Inventors: Mintu Dutta, Karnataka (IN); Sameera Bharadwaja Hayavadana, Karnataka (IN); Shashank Shrikant Agashe, Karnataka (IN); Rathish Balagangadhar, Karnataka (IN); Anmol Varma, Karnataka (IN); Heon Ju Shin, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 111 days.

(21) Appl. No.: 16/523,310

(22) Filed: Jul. 26, 2019

(65) Prior Publication Data
US 2020/0034511 A1 Jan. 30, 2020

(30) Foreign Application Priority Data
Jul. 27, 2018 (IN) .............................. 201841028375

(51) Int. Cl.
*G06F 30/392* (2020.01)
*G06F 30/398* (2020.01)
*G03F 1/84* (2012.01)
*G03F 7/20* (2006.01)

(52) U.S. Cl.
CPC .............. *G06F 30/398* (2020.01); *G03F 1/84* (2013.01); *G03F 7/70616* (2013.01)

(58) Field of Classification Search
CPC ........ G06F 30/398; G03F 1/84; G03F 7/7065; G01N 21/9501; H01L 22/12
See application file for complete search history.

(56) References Cited

U.S. PATENT DOCUMENTS

| | | | |
|---|---|---|---|
| 6,691,052 B1 | 2/2004 | Maurer | |
| 7,167,185 B1* | 1/2007 | Yiin | G03F 1/84 345/590 |
| 9,390,490 B2* | 7/2016 | Takagi | G06T 7/001 |
| 2007/0210252 A1* | 9/2007 | Miyamoto | H01J 37/265 250/310 |
| 2015/0219715 A1* | 8/2015 | Schachtner | G01R 31/2601 702/118 |

(Continued)

*Primary Examiner* — Nghia M Doan
(74) *Attorney, Agent, or Firm* — Volentine, Whitt & Francos, PLLC

(57) ABSTRACT

A method is disclosed of generating a die tensor of a wafer from a Computer-Aided Design (CAD) file. According to the method, a segmentation engine segments a wireframe image obtained from the CAD file into a plurality of entities. An image transformation engine performs a transform on each of the plurality of entities based on at least one of the wireframe image, metrology, a design specification, process information, and optical information. The transform is performed iteratively based on the optical information. A stitch engine generates a die tensor, having a predefined number of slices, by combining each of the transformed plurality of entities.

20 Claims, 2 Drawing Sheets

(56) References Cited

U.S. PATENT DOCUMENTS

| | | | |
|---|---|---|---|
| 2016/0019689 A1* | 1/2016 | Inoue | G03F 1/84 382/149 |
| 2017/0148226 A1 | 5/2017 | Zhang et al. | |

\* cited by examiner

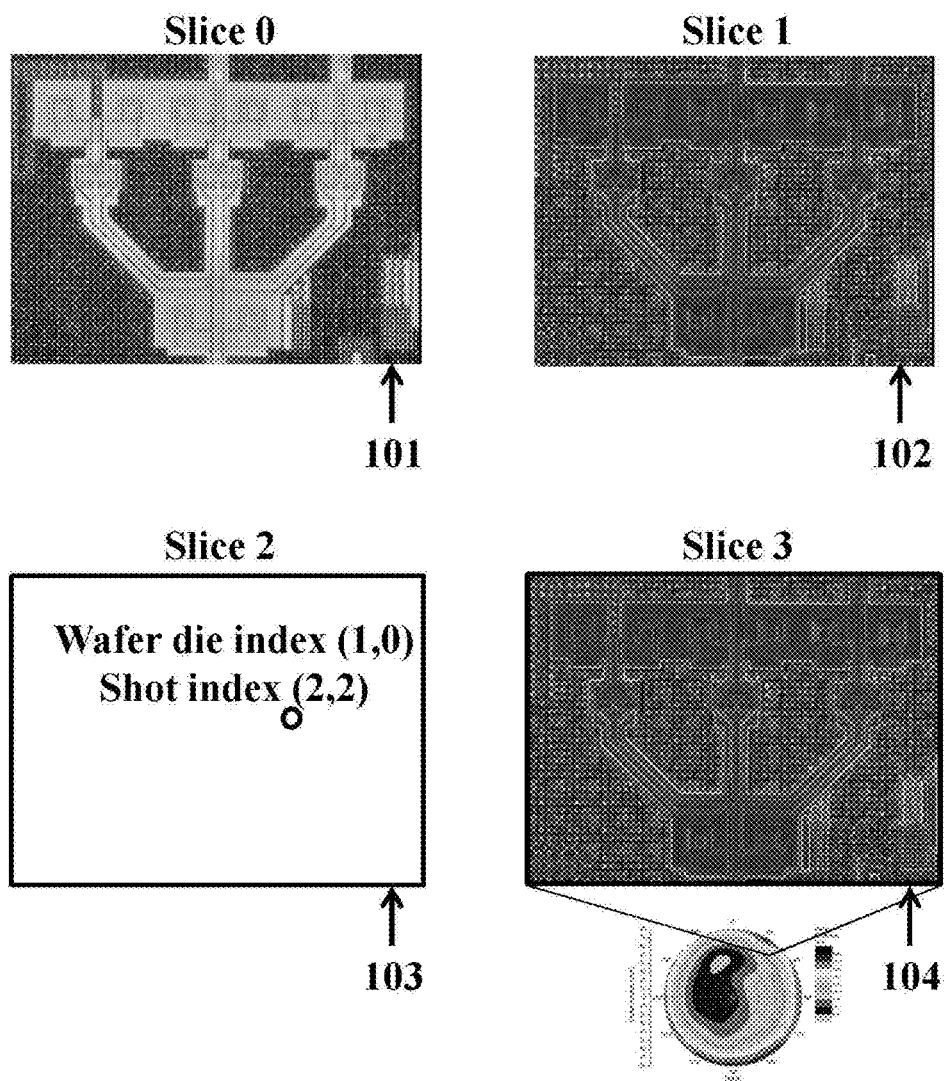

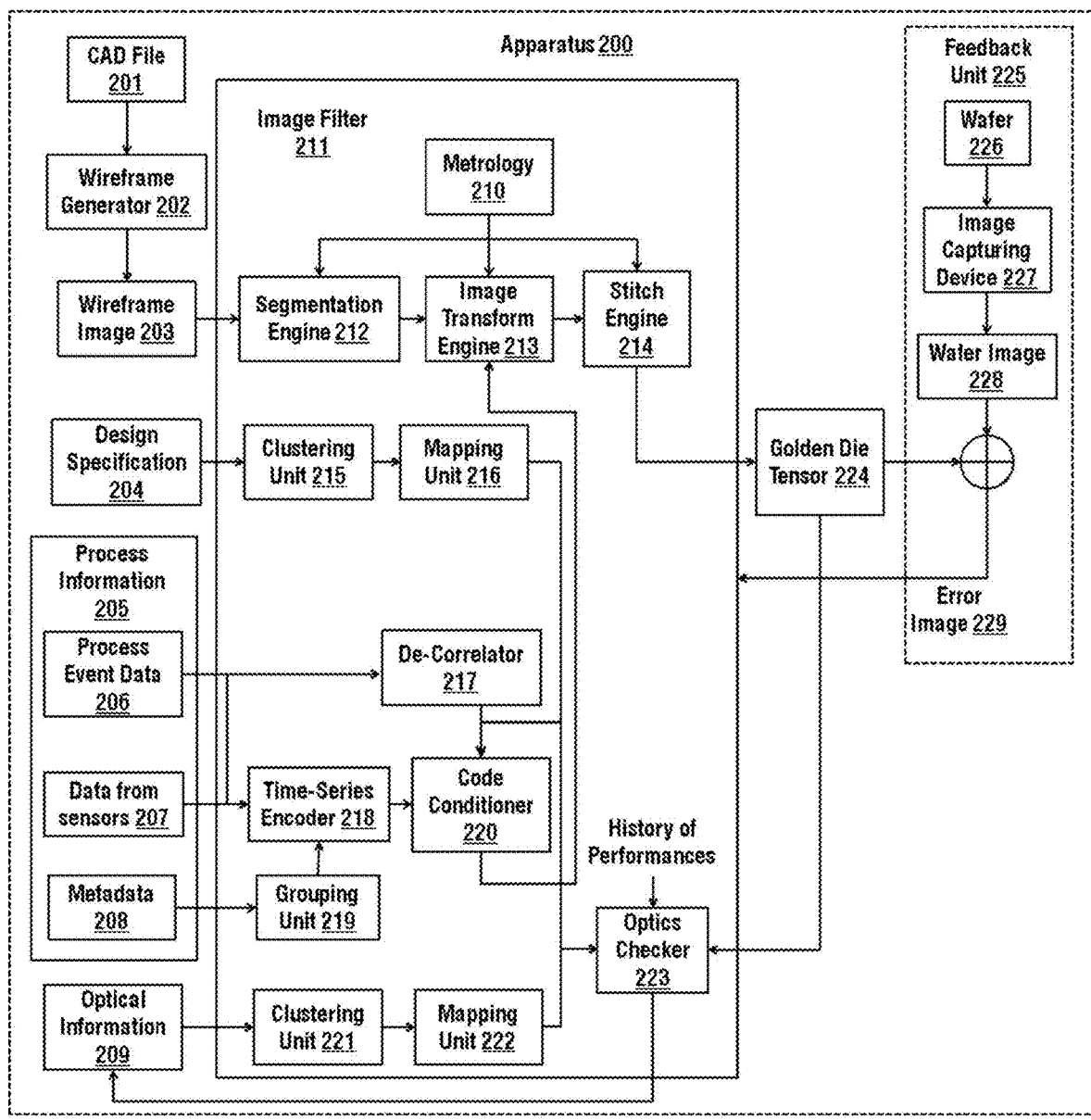

METHODS AND SYSTEMS FOR WAFER IMAGE GENERATION

CROSS-REFERENCE TO RELATED APPLICATION

This application claims priority from Indian Patent Application No. 201841028375 filed on Jul. 27, 2018, and all the benefits accruing therefrom under 35 U.S.C. 119, the contents of which in their entirety are herein incorporated by reference.

TECHNICAL FIELD

Embodiments herein relate to wafer inspection, and more particularly to methods and systems for generating a die tensor of a wafer.

BACKGROUND

For imprinting an Integrated Circuit (IC) on a wafer, a reticle (mask) can be prepared from a Computer Aided Design (CAD) file, which includes a design specification of the IC. The reticle (mask), which contains the design of the chip can be transferred on to the wafer through various semi-manufacturing processes such as deposition, lithography, etch, diffusion, and so on, in recurrent sequences. Process variations can arise out of any of these process steps and hence need to be inspected for detecting defects. This detection of such defects can be referred to as wafer inspection.

In order to perform an inspection, an image of the wafer can be captured using an optical system. Thereafter image processing techniques can be utilized for detecting the presence of defects in the wafer. In an example, consider a wafer having multiple dies, ICs, or chips of a same type arranged in a repetitive pattern. The gray scale values of a die can be compared with the gray scale values of another neighboring die. If the compared value exceeds a predefined threshold value, it can be concluded that defects are present in the die. A similar strategy can be used for detecting defects within a particular die. The gray scale values of the neighboring dies can be used as reference values for detection of defects. However, if the reference value itself is defective, then the detected defect is likely to be false. This can lead to propagation of false detection. Moreover, inspection of the wafer by comparing the gray scale values of all dies in the wafer with that of their respective neighboring dies can be a time-consuming process.

Objects

An object of the embodiments herein is to disclose methods and systems for generating a multi-dimensional image of a wafer from a CAD file, wherein the CAD file comprises attributes of imaging and manufacturing processes for granular recipe creation, fine defect detection in the wafer, generating information related to wafer manufacturing process, generating optical parameters from inspection tools or a camera, wafer metrology, and so on.

SUMMARY

Accordingly, the embodiments provide methods and systems for generating a die tensor of a wafer from a CAD file. The embodiments include generating a reference image which can be used for detection of defects in the wafer by comparing dies in the reference image with dies in an actual image of the wafer. The reference image can be generated from a CAD file, which includes a circuit design of the wafer. The generated reference image of the wafer can be referred to as a die tensor. The die tensor can include a predefined number of slices, the usage of which can lead to accurate detection of defects in the dies of the wafer.

According to an embodiment, a method of generating a die tensor of a wafer from a Computer-Aided Design (CAD) file includes segmenting into a plurality of entities, by a segmentation engine, a wireframe image obtained from the CAD file. An image transformation engine performs a transform on each of the plurality of entities based on at least one of the wireframe image, metrology, a design specification, process information, and optical information. The transform is performed iteratively based on the optical information. A stitch engine generates a die tensor having a predefined number of slices by combining each of the transformed plurality of entities.

According to an embodiment, an apparatus for generating a die tensor of a wafer from a Computer-Aided Design (CAD) file includes a segmentation engine that segments a wireframe image, obtained from the CAD file, into a plurality of entities. An image transformation engine performs a transform on each of the plurality of entities based on at least one of the wireframe image, metrology, a design specification, process information and optical information. The transform is performed iteratively based on the optical information. A stitch engine generates a die tensor having a predefined number of slices by combining each of the transformed plurality of entities.

According to an embodiment, a method of manufacturing a reference image of a wafer includes segmenting a wireframe image obtained from a Computer-Aided Design (CAD) file into segments. An Nth image transform is performed on each of the segments, based on Nth optical information, to generate Nth transformed segments. The reference image is manufactured by combining the Nth transformed segments.

These and other aspects of the embodiments herein will be better appreciated and understood when considered in conjunction with the following description and the accompanying drawings. It should be understood, however, that the following descriptions, while indicating embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF FIGURES

This disclosure is illustrated in the accompanying drawings, through out which like reference characters indicate corresponding parts in the various figures. The embodiments herein will be better understood from the following description with reference to the drawings, in which:

FIG. 1 depicts slices of a generated die tensor, according to embodiments as disclosed herein; and FIG. 2 depicts various units of an apparatus for generating the die tensor, according to embodiments as disclosed herein.

DETAILED DESCRIPTION

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

Embodiments herein disclose methods and systems for generating a die tensor of a wafer from a Computer-Aided Design (CAD) file. The embodiments include generating a reference image which can be used for detection of defects in the wafer by comparing dies in the reference image with dies in an actual image of the wafer. The reference image can be generated from a CAD file, which includes a circuit design of the wafer. The generated reference image of the wafer can be referred to as die tensor. The die tensor can include a predefined number of slices, the usage of which can lead to accurate detection of defects in the dies of the wafer.

Referring now to the drawings, and more particularly to FIGS. 1 and 2, where similar reference characters denote corresponding features consistently throughout the figures, there are shown preferred embodiments.

FIG. 1 depicts slices of a generated die tensor, according to embodiments as disclosed herein. As depicted in FIG. 1, in an example, the die tensor comprises of four slices. The slices are referred to herein as slice 0, 1, 2, and 3. Slice 0 can be the generated reference image. The generated reference image can be used for detection of defects in the wafer. The defects can be detected by comparing dies in the die tensor with the dies in an actual image of the wafer. As the number of slices of the die tensor increases, the accuracy of wafer inspection increases.

A plurality of images of a wafer can be captured by changing the optical conditions. At a particular location of the wafer, the gray scale values at a particular pixel in each of the plurality of images may differ. This can provide a gray scale value distribution (histogram) of the particular pixel, at the particular location of the die tensor. Slice 1 can demonstrate the gray scale distribution of the generated image (die tensor).

The gray scale values of the pixels at a particular location of the die tensor can be compared with the gray scale values of the pixels of the actual image of the wafer. The embodiments include setting predefined threshold difference values between the grayscale values of the reference image and the actual image, for the pixels at different locations. If the grayscale difference value, for a particular pixel in a location, is greater than the predefined threshold difference value set at that location, then it can be concluded that a defect may exist in the die(s) in that location of the wafer. As such, setting the predefined threshold difference values for different locations of the die tensor is critical. The predefined threshold difference values can be set based on the gray scale distribution of the pixels in the die tensor.

The gray scale distribution can provide information in regards to sensitivity of a pixel to various noisy optical conditions, prevent false detection of defects, and so on. This helps in setting a predefined threshold difference value for each pixel. Information obtained from the further slices can be considered for setting the predefined threshold difference values.

Slice 2 can provide the location of the different dies in the wafer. The location of a die in the wafer can be indicated using a wafer die index and a shot index. In an example, as depicted in FIG. 1, the wafer die index of a die can be (1, 0) and the shot index of the die can be (2, 2). Based on optical conditions, the different parts of the reference image depicting the different locations of the wafer, may appear different. This can be due to differences between gray scale values of the pixels at the centre and the edges of the wafer. Further, dies in the centre of the wafer may have different characteristics compared to the dies at the edges of the wafer. The characteristic difference may occur during the processing steps of manufacturing. As such, different threshold difference values can be set for detecting defects in the dies at the different parts (locations) of the die tensor.

Slice 3 provides a variation of thickness across the wafer. The variation of thickness can affect the grayscale values of the pixels at different locations of the die tensor. The thickness variation can be considered for setting the predefined threshold difference values. The embodiments allow inclusion of further slices, which can take care of further variations (in addition to gray scale value differences between the pixels, location of a die in the wafer, thickness of the wafer), which can affect the quality of the wafer.

FIG. 2 depicts various units of an apparatus 200 for generating a die tensor 224, according to embodiments as disclosed herein. The apparatus 200 includes an image filter 211, which can generate the die tensor 224, with a predefined number of slices, based on inputs from a CAD file 201, a design specification 204, process information 205, metrology 210 and optical information 209. In an example, the die tensor 224 can include four slices, viz., 101, 102, 103, and 104. The image filter 211 can iteratively generate the die image 224 by recipe tuning using a feedback unit 225.

The CAD file 201 can be one of the inputs to the image filter 211. The CAD file 201 can include the complete design architecture of a wafer 226. The CAD file 201 can further include logical circuits, connections between the circuits, location of the dies, and so on. A wireframe generator 202 can read the CAD file 201 and generate a wireframe image 203. The wireframe image 203 can depict an artificial circuit diagram.

The metrology 210 can be specific to a manufactured product. The metrology 210 can be inputs obtained from measurements of metrology parameters on wafers of similar products, which have been produced earlier. The metrology 210 can also include the effects of specific process steps such as photolithography, diffusion, etching, and so on, on the wafers of the similar products. The metrology information can be predicted using the sensors values for the wafer process steps, previous metrology readings, process event data (such as recipe change). These values can be combined in machine learning methods to arrive at a predicted value of the metrology readings.

The design specification 204 can include the design of the circuits of the dies, which are to be imprinted on the wafer 226. The design specification 204 may be a part of the CAD file 201. When the CAD file 201 is converted to an image, the design specification 204 may be lost. The embodiments include extracting the design specification 204 and providing it to the image filter 211 as an input. The design specification 204 can be extracted from the CAD file 201 using parser tools.

While the die tensor 224 is generated, a reticle can be masked on a wafer 226, and an image of the wafer 228 can be captured at particular optical conditions in the feedback unit 225. There can be a plurality of process equipments which can perform chemical processes on the wafer 226. The processes can be etching, photolithography, deposition, and so on. The equipments performing at least one of the processes can be referred to as process equipments (process tools). In an example, an etcher tool can drill patterns at different locations on the wafer 226, a deposition tool can deposit chemicals or compounds on the wafer 226 in a certain fashion, a photolithography tool can print different types of patterns on the wafer 226, and so on.

Process information 205 can be the information which is obtained from the plurality of process equipments. When the chemical processes are performed, various types of data can be collected by the process equipments. The process information 205 can comprise process event data 206, data collected by sensors in the process equipments 207, metadata 208, and so on. The process information 205 can be obtained by the image filter 211 as one of the inputs for generating the die tensor 224. In an example, consider that the wafer is stationed in a chamber during one of the processes. The process event data 206 can be an increase or decrease in pressure inside a chamber (process equipment). The data measured by the sensors 207 in the process equipments can be temperature, pressure, current, voltage, impedance, and so on. The data collected from the sensors 207 can be represented in a time series. The metadata 208 can be information about the wafer product, recipe, device, chamber, and so on.

The optical information 209 includes the optical parameters and conditions which can influence an image of the wafer (wafer image) 228 being captured. The optical information 209 can act as tunable recipe parameters, which can be obtained by the image filter 211 to generate the die tensor 224. The die tensor 224 can be fed to the feedback unit 225, which can perform an image operation to generate an error image 229. The feedback unit 225 can obtain the wafer image 228 from the wafer 226 using an image capturing device 227. An image operation can be performed on the wafer image 228 and the die tensor 224 to generate the error image 229. Based on the error image 229 (feedback), recipe tuning can be performed and the optical information 209 can be updated, to regenerate the die tensor 224. Thus, the die tensor 224 can be generated iteratively, until the final generated die tensor 224 is a perfect reference image to be used for inspection of the wafer 226.

The image filter 211 can include a segmentation engine 212, which can segment the wireframe image 203 into multiple unique entities, wherein each of the unique entities can have a die pattern, which can be repetitive in nature. Each of the unique entities can be transformed in parallel before being stitched again. The segments (unique entities) can be overlapping to avoid boundary artifacts while stitching.

The image filter 211 can include an image transform engine 213. The image transform engine 213 can obtain the inputs from the CAD file 201, the design specification 204, the process information 205, the metrology 210 and the optical information 209, either directly or through other units in the image filter 211. The image transform engine 213 can transform the segmented parts in parallel using the inputs.

The transformation can be performed using methods which are in turn designed using machine learning methods. In an embodiment, the slice 0 can be compared with the wafer image 228, taken on the physical wafer using the image capturing device 227 in the feedback unit 225, during training for optimization of recipe parameters. Based on the comparison, the error image 229 is generated. The error image 229 is fed back to the image filter 211. The error image can be utilized as a tool during the machine learning in order to generate the methods for transforming the segmented parts. The image filter 211 can include a stitch engine 214 which can stitch the transformed segmented parts to generate the die tensor 224.

The design specification 204, obtained from the CAD file 201, and the metrology 210 can be used by the image transform engine 213 for generating relevant features of a die captured in the die tensor 224. The image filter 211 can include a clustering unit 215 and a mapping unit 216. The clustering unit 215 can cluster features of the die which can have similar effects on the appearance of the die tensor 224. The mapping unit 216 can assign a code or key-ID to each cluster.

The image filter 211 can include another clustering unit 221 and another mapping unit 222. The clustering unit 221 can cluster optical parameters which can have similar effects on the appearance of the die tensor 224. Clustering is performed in order to combine the optical parameters which have the similar effects. The mapping unit 222 can assign a code or key-ID to each cluster.

The image filter 211 can include an optics checker 223. The optics checker 223 can receive the code or key-IDs of clusters, formed on the basis of features of a die and optical parameters having similar effect on appearance of the die tensor 224. The optics checker 223 can also receive the generated die tensor 224 and history of performance of similar imprinted wafers. Based on the received inputs, the optics checker 223 can update the optical information 209. The updated optical information 209 can be, thereafter, used for generating an updated die tensor 224 in a subsequent iteration.

The image filter 211 can include a de-correlator 217, a time series encoder 218, a grouping unit 219, and a code conditioner 220.

The time series encoder 218 can convert the process event data 206 and the data collected by sensors 207 (time series or signal data), in the process equipments, into a code vector. The time series encoder 218 can encode the process information 205 such as the process event data 206 and the data collected by sensors 207, into a feature space, i.e., perform feature extraction of the process information 205. The encoding can be through various machine learning methods such as Auto-Encoder (AE), Principal Component Analysis (PCA), Restricted Boltzmann Machine (RBM), Convolution Neural Networks (CNN), Recurrent Neural Networks (RNN), and so on. The grouping unit 219 can group the process information 205 which is similar based on the metadata 208. The grouped process information can be fed to the time series encoder 218.

The de-correlator 217 can obtain the process information 205 such as process event data 206 and the data collected by sensors 207. The process event data 206 and the data collected by sensors 207 can be thereafter combined for computing de-correlated information.

The code conditioner 220 can condition the extracted features such that the repetitive information, if it exists, in the extracted features can be ignored. This can reduce memory and computational costs. The conditioning can be performed based on the computed de-correlated information. Based on the process information 205, obtained through the time series encoder 218 and the de-correlator 217, the code conditioner 220 can report the health of the processes to the image transform engine 213. The results of the processes (health), performed on the wafer 226, are critical factors, which can influence the appearance of the generated die tensor 224. In an example, consider the process of photolithography; if it is not possible to apply an adequate temperature, then the desired thickness of the resist may not be achieved. This can influence the appearance of the die tensor 224.

The image transform engine 213 can obtain the process information 205, design specification 204 and optical information 209 through the code conditioner 220; and the metrology 210 directly, for performing a transformation on the segmented entities in parallel.

The embodiments disclosed herein can be implemented through at least one software program running on at least one hardware device and performing network management functions to control the network elements. The network elements shown in FIG. 2 include blocks which can be at least one of a hardware device, or a combination of hardware device and software module.

The embodiments disclosed herein describe methods and systems for generating an image of a wafer from a CAD file. Therefore, it is understood that the scope of the protection is extended to such a program and in addition to a computer readable means having a message therein, such computer readable storage means contain program code means for implementation of one or more steps of the method, when the program runs on a server or mobile device or any suitable programmable device. The method is implemented in a preferred embodiment through or together with a software program written in e.g. Very high speed integrated circuit Hardware Description Language (VHDL), another programming language, or implemented by one or more VHDL or several software modules being executed on at least one hardware device. The hardware device can be any kind of portable device that can be programmed. The device may also include means which could be e.g. hardware means like e.g. an ASIC, or a combination of hardware and software means, e.g. an ASIC and an FPGA, or at least one microprocessor and at least one memory with software modules located therein. The method embodiments described herein could be implemented partly in hardware and partly in software. Alternatively, the disclosure may be implemented on different hardware devices, e.g. using a plurality of CPUs.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the embodiments as described herein.

We claim:

1. A method of generating a die tensor of a wafer from a Computer-Aided Design (CAD) file, the method comprising:

segmenting into a plurality of entities, by a segmentation engine, a wireframe image obtained from the CAD file;

performing, by an image transformation engine, a transform on each of the plurality of entities based on optical information; and generating a die tensor comprising a predefined number of slices by combining, by a stitch engine, each of the transformed plurality of entities, wherein the slices comprise a reference image, a gray scale distribution of the reference image, a location of dies in the wafer, and a thickness variation across the wafer.

2. The method of claim 1, wherein the image transformation engine further performs the transform on each of the plurality of entities based on process information comprising process event data, data collected by sensors in at least one process equipment, and metadata of at least one process.

3. The method of claim 2, wherein:

the process event data and data collected by sensors are obtained by a time-series encoder to perform a feature extraction of the process information, and the process information is grouped based on the metadata.

4. The method of claim 3, wherein health of the at least one process is provided to the image transform engine by a code conditioner, based on the feature extraction and grouped process information.

5. The method of claim 1, wherein features of a die, generated from a design specification, are clustered based on effects on appearance of the die tensor.

6. The method of claim 1, wherein optical parameters and optical conditions in the optical information are clustered based on effects on appearance of the die tensor.

7. The method of claim 1, wherein:

the optical information is updated by an optic checker based on an error image received from a feedback unit, and the error image is generated by performing an image operation between the die tensor and an image of the wafer.

8. The method of claim 1, wherein the image transformation engine further performs the transform on each of the plurality of entities based on the wireframe image.

9. The method of claim 1, wherein the image transformation engine further performs the transform on each of the plurality of entities based on metrology.

10. The method of claim 1, wherein the image transformation engine further performs the transform on each of the plurality of entities based on a design specification.

11. The method of claim 1, wherein the image transformation engine further performs the transform on each of the plurality of entities based on process information.

12. An apparatus for generating a die tensor of a wafer from a Computer-Aided Design (CAD) file, the apparatus comprising:
- a segmentation engine that segments a wireframe image, obtained from the CAD file, into a plurality of entities;
- an image transformation engine that performs a transform on each of the plurality of entities based on optical information; and
- a stitch engine that generates a die tensor comprising a predefined number of slices by combining each of the transformed plurality of entities, wherein
- the slices comprise a reference image, a gray scale distribution of the reference image, a location of dies in the wafer, and a thickness variation across the wafer.

13. The apparatus of claim 12, wherein the image transformation engine further performs the transform on each of the plurality of entities based on process information comprising process event data, data collected by sensors in at least one process equipment, and metadata of at least one process.

14. The apparatus of claim 13, further comprising:
- a time-series encoder that obtains the process event data and data collected by sensors to perform a feature extraction of the process information, wherein
- the process information is grouped based on the metadata.

15. The apparatus of claim 14, wherein health of the at least one process is provided to the image transform engine by a code conditioner, based on the feature extraction and grouped process information.

16. The apparatus of claim 12, wherein features of a die generated from a design specification are clustered based on effects on appearance of the die tensor.

17. The apparatus of claim 12, wherein optical parameters and optical conditions in the optical information are clustered based on effects on appearance of the die tensor.

18. The apparatus of claim 12, wherein:
- the optical information is updated by an optic checker based on an error image received from a feedback unit, and
- the error image is generated by performing an image operation between the die tensor and an image of the wafer.

19. The apparatus of claim 12, wherein the image transformation engine further performs the transform on each of the plurality of entities based on the wireframe image or metrology.

20. The apparatus of claim 12, wherein the image transformation engine further performs the transform on each of the plurality of entities based on a design specification or process information.

* * * * *